United States Patent
Heragu et al.

(10) Patent No.: US 6,930,953 B2
(45) Date of Patent: Aug. 16, 2005

(54) SELF-TIMED STROBE GENERATOR AND METHOD FOR USE WITH MULTI-STROBE RANDOM ACCESS MEMORIES TO INCREASE MEMORY BANDWIDTH

(75) Inventors: Keerthinarayan P. Heragu, Irving, TX (US); Mustafa Ulvi Erdogan, Richardson, TX (US); Robert James Landers, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 73 days.

(21) Appl. No.: 10/634,589

(22) Filed: Aug. 5, 2003

(65) Prior Publication Data

US 2004/0052153 A1 Mar. 18, 2004

Related U.S. Application Data

(60) Provisional application No. 60/410,977, filed on Sep. 16, 2002.

(51) Int. Cl.[7] ................................................. G11C 8/00
(52) U.S. Cl. .................................... 365/233; 365/230.02
(58) Field of Search .............................. 365/233, 230.02

(56) References Cited

U.S. PATENT DOCUMENTS

| | | | |
|---|---|---|---|
| 5,802,555 A | 9/1998 | Shigeeda | 711/106 |
| 6,091,663 A * | 7/2000 | Kim et al. | 365/233 |
| 6,456,544 B1 | 9/2002 | Zumkher | 365/193 |
| 6,496,445 B2 | 12/2002 | Lee | 365/233 |
| 6,580,305 B1 | 6/2003 | Liu et al. | 327/298 |

* cited by examiner

*Primary Examiner*—M. Tran
(74) *Attorney, Agent, or Firm*—Alan K. Stewart; W. James Brady, III; Frederick J. Telecky, Jr.

(57) ABSTRACT

A circuit takes a reference strobe signal as a first input, and a strobe ready signal generated from a memory that is strobed by the reference strobe signal as a second input. The circuit generates a self-timed strobe signal along with other control signals that are used to perform a subsequent memory access in a single clock cycle, thereby doubling memory access bandwidth.

19 Claims, 2 Drawing Sheets

SELF-TIMED STROBE GENERATOR AND METHOD FOR USE WITH MULTI-STROBE RANDOM ACCESS MEMORIES TO INCREASE MEMORY BANDWIDTH

CROSS-REFERENCE TO RELATED APPLICATIONS

This application claims priority under 35 U.S.C. §119(e) to U.S. Provisional Patent Application Ser. No. 60/410,977 entitled SELF-TIMED STROBE GENERATOR AND A METHOD TO USE IT WITH MULTI-STROBE RANDOM ACCESS MEMORIES TO DOUBLE BANDWIDTH filed in the name of Heragu et al. on Sep. 16, 2002, the entirety of which is hereby incorporated by reference.

FIELD OF THE INVENTION

This invention generally relates to electronic digital logic circuitry, and in particular it relates to the clocking of logic stages.

BACKGROUND OF THE INVENTION

A chip that includes a memory, such as a static random access memory (SRAM), a dynamic random access memory (DRAM), or a synchronous dynamic random access memory (SDRAM), typically uses a system clock to generate signals for allowing memory accesses, including read and write functions. Rising and/or falling edges of the system clock signal are used to trigger the strobe inputs.

In such memories with multiple strobe inputs, read or write memory operations may occur at a rising edge of any strobe signal. One way to generate two strobes is to use the system clock to generate the first strobe signal and an inversion of the system clock to generate the second strobe signal. This introduces a requirement to maintain a duty cycle for memory functions that does not substantially deviate from 50% of the clock cycle, in order to optimize memory access bandwidth.

A precise 50% duty cycle is often difficult to achieve or maintain, particularly as the complexity of an integrated circuit (IC) increases. With the increasing functionality of modern electronic devices, there are corresponding increases in the demands being placed on memory bandwidth. An economical solution for increasing memory bandwidth would therefore be beneficial, particularly where such a solution could be adapted for existing memory devices.

SUMMARY OF THE INVENTION

Accordingly, the present disclosure introduces a self-timed strobe generating circuit and a method of using such a circuit cooperatively with, for example, a multi-strobe random access memory device to increase memory bandwidth. In particular, one aspect of the disclosure includes providing a clock pulse to a first strobe input of the memory for initiating a first memory access. The data input may be determined based on a state of a SELECT signal generated by the self-timed strobe generating circuit. The memory generates a strobe ready signal after the first memory access, which results in the self-timed circuit generating a second strobe signal, after inherent timing delays in the circuit. This delayed strobe signal, in turn, is provided to a second strobe input of the memory during the clock pulse for initiating a second memory access in the same clock cycle, thus doubling the stand-alone access bandwidth of a like memory operating without the self-timed circuit.

In certain embodiments, the self-timed circuit includes first and second standard flip-flops, or other sequential elements of similar functionality, each having a clock input, a data input and a data output. The clock input of the first flip-flop receives the clock pulse from a system clock that is used to initiate a first memory access while a SELECT signal is low. The data output of the first flip-flop transmits a high SELECT signal in response to the rising edge of the clock pulse. The data output of the first flip-flop is further connected to the data input of the second flip-flop for transmitting the high SELECT signal thereto. The clock input of the second flip-flop receives a strobe ready signal from the memory after the first memory access. In response to the rising edge of the strobe ready signal and the high SELECT signal, the data output of the second flip-flop transmits a second strobe signal to initiate a second data access for the memory during the same clock pulse.

BRIEF DESCRIPTION OF THE DRAWINGS

Further aspects of the present disclosure will be more readily appreciated upon review of the detailed description of its various embodiments, described below, when taken in conjunction with the accompanying drawings, of which.

DETAILED DESCRIPTION OF THE SPECIFIC EMBODIMENTS

Referring now to FIGS. 1–4, wherein similar components of the present disclosure are referenced in like manner, various embodiments of a self-timed circuit and methods of using the same with a memory to increase memory bandwidth are disclosed.

Figure 1:
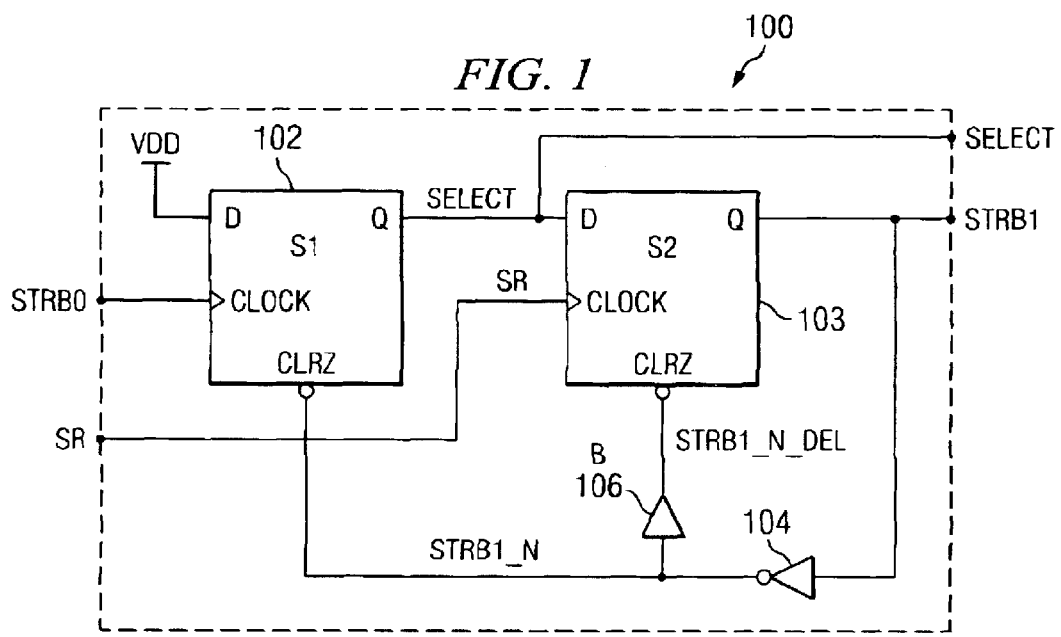
FIG. 1 is a circuit diagram of an exemplary circuit for generating a self-timed strobe signal according to the present disclosure.

Turning now to FIG. 1, there is depicted one embodiment of a self-timed circuit 100 for allowing increased memory bandwidth access. In this embodiment, the self-timed circuit 100 includes first and second flip-flops 102, 103, that may both be well-known timing components commonly referred to as a D flip-flop. Although the following descriptions reference the use of D flip-flops, it should be readily apparent to one of skill in the art that various combinations of devices may be used to accomplish the functionality of the self-timed circuit 100 described herein For example, either or both flip-flops 102, 103 may be known J-K or R flip-flops with appropriate connections, and perhaps additional circuit components, to achieve the memory access timing depicted in FIG. 2. Components other than flip-flops may also be used.

A standard D flip-flop has a data input (D), a clock input (CLK) and a data output (Q). The output Q always takes on the state of the input D at the moment of a rising clock edge on CLK, for positive-edge triggered versions of the flip-flop device. When the input to CLK falls to logic 0, the output Q can change states. When the input to CLK is at either the high or low level, the D input signal has no effect at the output Q. The D flip-flop may also have a direct clear input (CLRZ) for clearing the output Q upon receipt of a particular signal thereto.

The self-timed circuit 100 accepts an input of system clock (also referred to herein as a first strobe signal or STRB0) at the clock input CLK of a first flip-flop 102. The CLK signal may be generated from an external system clock that puts out a periodic series of clock pulses at a frequency (F), commonly measured in megahertz (MHz).

In order to perform two memory accesses per clock cycle on a two strobe RAM, the STRB0 signal may be communicated to a first strobe input of the RAM, for performing a first memory access, as well as to the clock input CLK of the first flip-flop. The output Q of the first flip-flop 102 is referred to as a SELECT signal that is used in conjunction with STRB1 to perform a second memory access in a single clock pulse. In particular, the state of the SELECT signal may be used to select appropriate data and address inputs for the memory from more than one data and address input lines of the memory. A second strobe signal is generated at the data output Q of the second flip-flop 103 in response to a strobe ready signal generated after the first memory access. The second strobe signal, and additional associated control signals generated by the first and second flip-flops 102, 103, together enable the second memory access after the first memory access and within the time of the same clock pulse.

In the particular configuration shown in FIG. 1, the two flip-flops 102, 103 may be configured as follows. The data input D of the first flip-flop 102 receives a constant logic high signal (VDD) so that the data output Q will always be logic 1 on the positive edge of a clock pulse STRB0. The clock input CLK of the first flip-flop 102 receives STRB0 from a system clock, used in conjunction with a low SELECT signal to perform a first memory access. The data output Q of the first flip-flop 102 generates a high SELECT signal in response the positive edge of STRB0, and after a brief propagation delay, the high SELECT signal is used by a memory to select a data input for a second memory access in conjunction with the STRB1 signal. The data output Q of the first flip-flop 102 is also connected to the data input D of the second flip-flop 103 for transmitting the high SELECT signal thereto. The clock input CLK of the second flip-flop 103 receives a strobe ready (SR) signal from the memory after the first memory access. In response to the rising edge of the SR signal, in conjunction with the high SELECT signal, the data output Q of the second flip-flop 103 then generates a second strobe signal (STRB1) used by the memory conjunction with the high SELECT signal to initiate a second data access during the same clock pulse of STRB0. Particular interactions of the inputs and outputs of the self-timed circuit 100 in conjunction with a memory are described further below with respect to FIGS. 3-4.

The self-timed circuit 100 may also include an inverter 104 and a buffer 106 for providing clear signals to the first and second flip-flops 102, 103. The input of the inverter 104 is connected to the data output Q of the second flip-flop 103 for receiving and inverting the strobe signal STRB1. The output of the inverter 104 is connected to the clear input CLRZ of the first flip-flop 102 for transmitting a clear signal (STRB1_N) that is low when STRB1 is high. The output of the inverter 104 is also connected to an input of the buffer 106 for transmitting the clear signal (STRB1_N) thereto. The output of the buffer 106, in turn, is connected to the clear input (CLRZ) of the second flip-flop 103 for transmitting a second delayed clear signal (STRB1_N_DEL) to clear the output Q of the second flip-flop 103 after an appropriate delay. Components to be used as the buffer 106 may be selected based on a desirable propagation delay of the outputs of such component.

Figure 2:
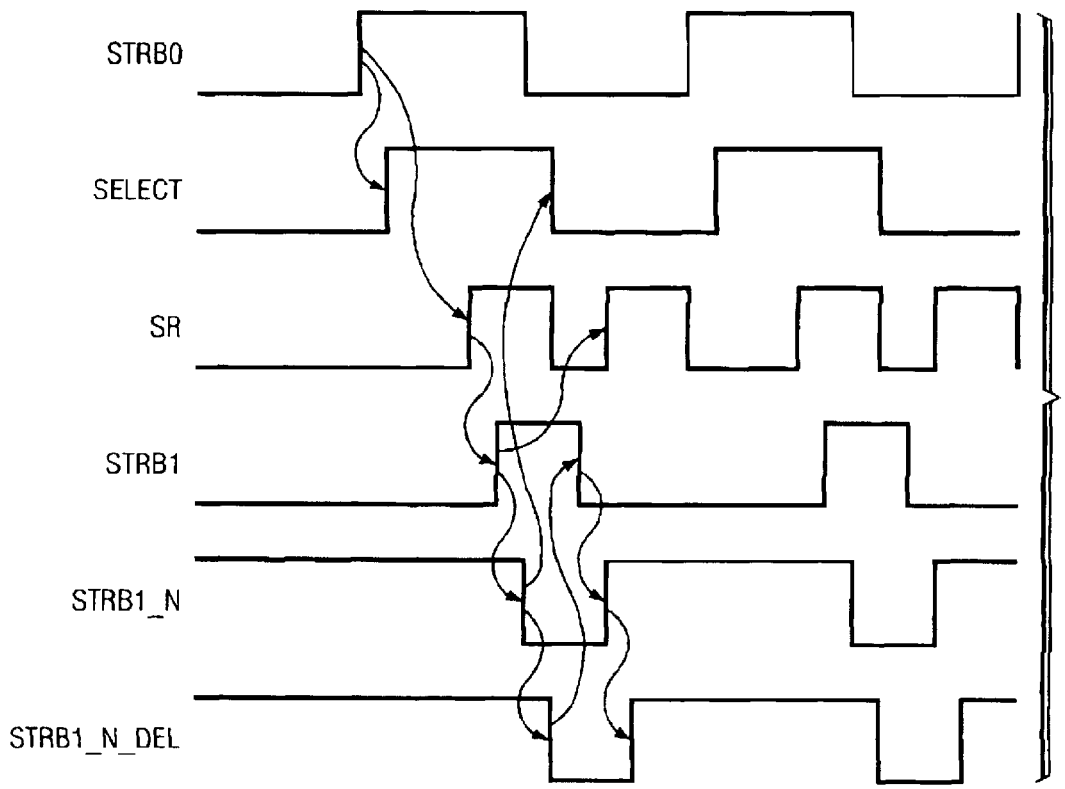
FIG. 2 is a timing diagram for the circuit of FIG. 1.

FIG. 2 shows a timing diagram of the inputs to and outputs from the self-timed circuit 100 of FIG. 1, including associated exemplary waveforms. Although the waveforms are displayed as substantially square waveforms with positive clock pulses, any suitable signaling may be used with a variety of known components in various equivalent configurations to achieve the timing of the signals displayed in FIG. 2.

As shown therein, the rising edge of the clock pulse STRB0, in conjunction with constant input VDD, causes the output Q (or SELECT) of the first-flip 102 to go high after a propagation delay associated with the first flip-flop 102. The memory 110 also responds to the rising edge of STRB0 and generates SR after a strobe cycle time associated with the memory 110, during which time a first memory access may be performed. The rising edge of SR, in turn, is provided to the CLK input of the second flip-flop 103, which responds by generating a STRB1 signal in conjunction with the SELECT input that is now high. The rising edge of STRB1 serves not only to clear the first flip-flop 102 via the inverter 104 using STRB1_N, but also to clear itself after a certain delay associated with the second buffer 106 using STRB1_N_DEL. The rising edge of STRB1 will also cause the memory 110 to generate a second rising edge on SR after a second memory access cycle time, but this has no effect on STRB1 since both SELECT and STRB1 are low by that point, as shown in FIG. 2.

Figure 3:
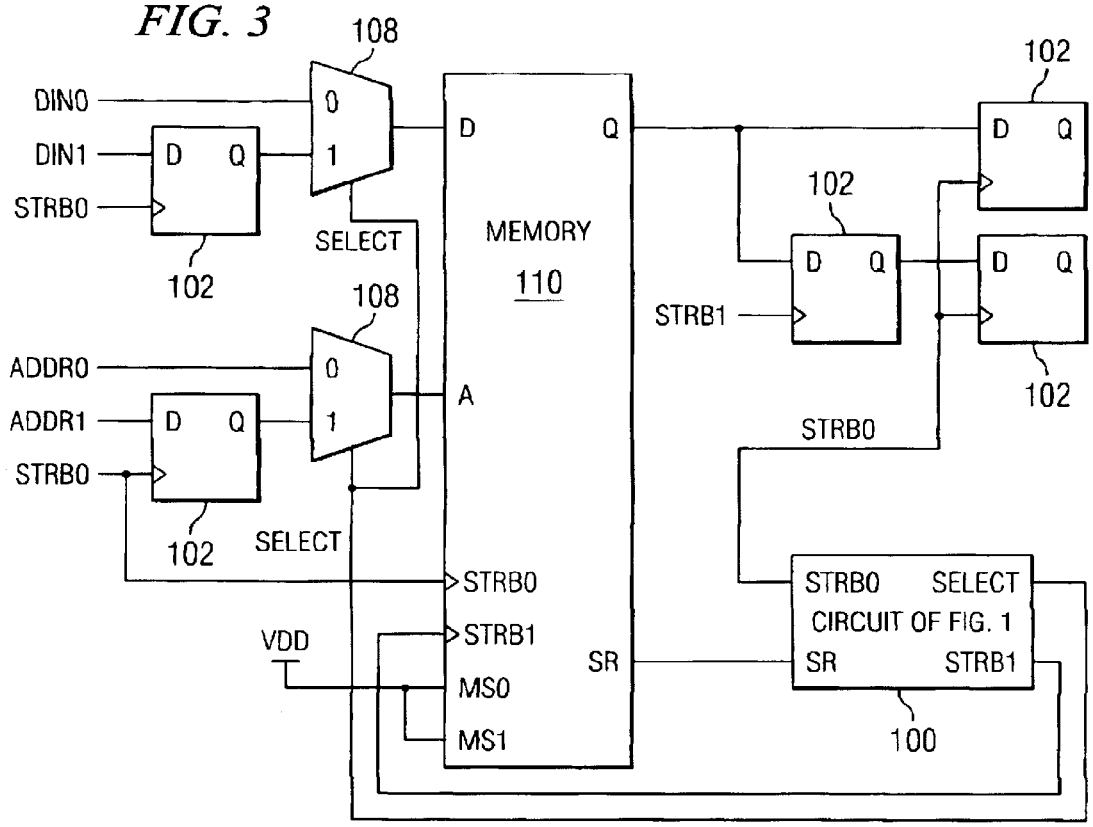
FIG. 3 is a circuit diagram for a first exemplary embodiment of a random access memory controlled by the circuit of FIG. 1.

FIG. 3 shows a first embodiment of the self-timed circuit 100 shown in FIG. 1 in communication with a memory 110. The memory 110 is depicted as a simplified version of a RAM, but the techniques described herein are applicable and can be extended to work with any multi-strobe or multi-clock RAM device, including SRAMs, DRAM, SDRAMs and the like which may have additional numbers of the data inputs and data outputs than as shown. The following descriptions of memory 110 in conjunction with FIG. 3 are applicable to the embodiment in FIG. 4 as well, and will not be repeated in the description of FIG. 4, where only the differences in the two embodiments will be referenced.

In the embodiment shown in FIG. 3, the inputs of the memory 110 are two strobe inputs (STRB0 and STRB1) each for selecting an associated internal memory register (not shown) that receive address information through input A and/or data information through input D to be stored or retrieved from the address.

The memory 110 may further include a write enable (WE) input (not shown), the function and operation of which is well known in the art. A logic high on WE indicates a write operation, during which data on D is written into a memory location, whose address is specified by A on the rising edge of STRB0 or STRB1. A logic low on WE indicates a read operation, during which stored data in the memory 110 whose address is specified by A, is then output on the memory output Q.

The data corresponding to DIN0, DIN1, ADDR0 and ADDR1 used for memory read/write functions may be handled by one or more multiplexers 108 that are responsive to the SELECT signal to select the data and addressing information received from external computing components (not shown) to pass to inputs D and A of the memory 110 in the following manner. A rising edge on STRB0 triggers a logic high on SELECT that is used to choose registered versions of DIN 1 and ADDR1 as inputs into the memory corresponding to STRB1, identified as input "1" on the input multiplexers 108. A rising edge on STRB1 triggers a logic low on SELECT that is used to choose DIN0 and ADDR0 as inputs into the memory corresponding to STRB0, identified as input "0" on the input multiplexers 108. STRB1 is also used to register the memory output Q substantially halfway through a clock cycle.

The memory 110 further has two memory select inputs (MS0 and MS1) for recognizing a signal to the first or second strobe inputs (STRB0 and STRB1, respectively) of the memory 110. A logic one on the MS0 input indicates that any signal to the strobe input STRB0 is to be recognized and a logic zero on MS0 indicates that any input to STRB0 is to be ignored. Signaling on MS1 operates likewise with respect to the strobe input STRB1.

Another output from the memory 110 is denoted as strobe-ready (SR). SR will output a logic high pulse when the strobe cycle time of the memory is met, thus indicating that a next memory access may be performed. Such memory accesses or read/write operations are thus enabled at each rising edge of either strobe STRB0 or STRB1. The SR signal is used by the self-timed circuit 100 in the manner described with respect to FIG. 1.

In the embodiment of FIG. 3, the STRB0 input receive the system clock signal STRB0. The STRB1 input is tied to the data output Q of the second flip-flop 103 of the self-timed circuit 100. The MS0 and MS1 inputs both receive a constant input signal VDD. The SR signal output by the memory 110 is communicated to the clock input of the second flip-flop 103 of the self-timed circuit 110.

Figure 4:
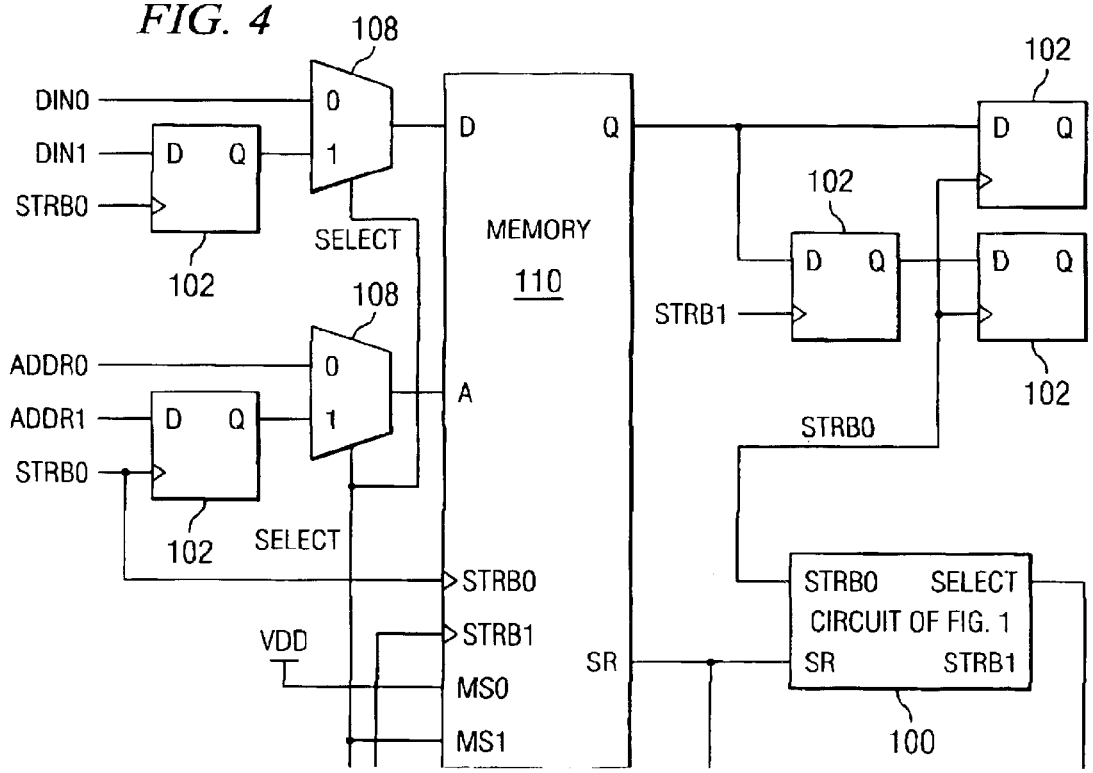
FIG. 4 is a circuit diagram for a second exemplary embodiment of a random access memory controlled by the circuit of FIG. 1.

FIG. 4 shows an alternate embodiment of the self-timed circuit 100 of FIG. 1 in communication with the memory 100. In this embodiment, only the MS0 input is tied to a constant signal VDD and the MS1 input is tied to the SELECT signal output by the self-timed circuit 100 of FIG. 1. The SR signal output by the memory 110 is communicated to the clock input of the second flip-flop 103 of the self-timed circuit 110, and is further communicated to the STRB1 input of the memory 110. This configuration may be used if the second memory access in the cycle needs to happen earlier than with the configuration shown in FIG. 3.

In either of the manners depicted in FIG. 3 and FIG. 4, as well in other equivalent embodiments that are contemplated but not particularly described herein, the self-timed circuit 100 achieves an effective doubling of memory access bandwidth of the memory 110 by allowing two read/write operations in a single clock cycle. This further is achieved without any resulting burst mode uncontrolled memory accesses that could happen, for example, if SR was simply directly tied to a MS input to provide a second strobe input STRB1. Such burst mode accesses can occur particularly as the speed of the memory 110 used increases.

In all embodiments described herein, it is readily contemplated that negative (or falling) edge triggering could be employed in place of positive (or rising) edge triggering, with appropriate inverters and the like placed in the system. Other equivalent configurations for any of the functions described herein are readily contemplated as being part of the present disclosure.

Although the best methodologies of the invention have been particularly described in the foregoing disclosure, it is to be understood that such descriptions have been provided for purposes of illustration only, and that other variations both in form and in detail can be made thereupon by those skilled in the art without departing from the spirit and scope of the present invention, which is defined first and foremost by the appended claims.

What is claimed is:

1. A method for timing memory access in a clocked circuit, comprising:

receiving a clock pulse used as a first strobe signal to a first strobe input of a memory for initiating a first memory access;

receiving a strobe ready (SR) signal from the memory after the first memory access;

the SR signal being generated by the memory after the first memory access is complete;

generating a second strobe signal in response to the strobe ready signal; and transmitting the second strobe signal to a second strobe input of the memory for initiating a second memory access during the clock pulse.

2. The method of claim 1, further comprising:

generating a select signal in response to the clock pulse; and providing the select signal to at least one data addressing multiplexer for selecting an input for the second memory access.

3. The method of claim 1, further comprising:

providing a constant input to at least one memory select (MS) input of the memory for allowing the first memory access and the second memory access.

4. The method of claim 1, further comprising:

providing a constant signal to a first memory select (MS) input of the memory for allowing the first memory access.

5. The method of claim 4, further comprising:

generating a select signal in response to the clock pulse; and providing the select signal to a second MS input of the memory and a data addressing multiplexer for allowing the second memory access.

6. The method of claim 1, further comprising:

generating a select signal in response to the clock pulse; and generating the second strobe signal in response to the SR signal and the select signal.

7. The method of claim 6, further comprising:

generating the select signal from an output of a first flip-flop; and generating the second strobe signal from an output of a second flip-flop.

8. The method of claim 1, the clock pulse comprising a clock pulse from a system clock.

9. The method of claim 1, the clock pulse comprising a positive clock pulse.

10. An apparatus for timing memory accesses, comprising:

a first flip-flop and a second flip-flop, each having a clock input, a data input and a data output;

the clock input of the first flip-flop for receiving a clock pulse from a system clock, the clock pulse for initiating a first memory access in a memory;

the data output of the first flip-flop for transmitting a select signal in response to the clock pulse, the data output of the first flip-flop further connected to the data input of the second flip-flop for receiving the select signal;

the clock input of the second flip-flop for receiving a strobe ready signal from the memory after the first memory access; and the data output of the second flip-flop for transmitting a strobe signal to initiate a second data access for the memory during the clock pulse in conjunction with the select signal.

11. The apparatus of claim 10, the data input of the first flip-flop receiving a constant signal.

12. The apparatus of claim 10, the first flip-flop and the second flip-flop each further comprising a clear input for clearing the data output, the apparatus further comprising:

an inverter and a buffer, each having an input and an output;

the input of the inverter connected to the data output of the second flip-flop for receiving the strobe signal;

the output of the inverter connected to the clear input of the first flip-flop for transmitting a clear signal generated by inverting the strobe signal, the output of the inverter further connected to the input of the buffer for receiving the clear signal;

the output of the buffer connected to the clear input of the second flip-flop for transmitting the clear signal after a delay.

13. The apparatus of claim 10, further comprising the memory.

14. The apparatus of claim 13, the memory comprising:

a first strobe input for receiving the clock pulse and initiating the first data access in response to the clock pulse;

a second strobe input for receiving the strobe signal and initiating the second data access in response to the strobe signal and the select signal during the clock pulse.

15. The apparatus of claim 13, the memory comprising:

a strobe ready output connected to the clock input of the second flip-flop for transmitting the strobe ready signal after a completion of the first memory access.

16. The apparatus of claim 13, further comprising:

a first memory select input for receiving a first memory select signal that enables the first memory access in conjunction with the clock pulse; and a second memory select input for receiving a second memory select signal that enables the second memory access in conjunction with the strobe signal and the select signal.

17. The apparatus of claim 16, the first memory select signal and the second memory select signal both being constant.

18. The apparatus of claim 16, the first memory select signal being constant;

the second strobe input connected to the strobe ready output for receiving the strobe ready signal; and the second memory select input connected to the data output of the first flip-flop for receiving the select signal.

19. The apparatus of claim 13, the memory further comprising:

a data input port for receiving data and an address input port for receiving an address in the memory to provide the data, the apparatus further comprising:

a multiplexer for transmitting the data to at least one of the data input port and the address input port, the multiplexer having a select input connected to the data output of the first flip-flop for receiving the select signal, the select signal allowing a selection of the data to be provided to the memory by the multiplexer, based on a state of the select signal.

* * * * *